United States Patent
Wu et al.

(10) Patent No.: US 7,259,823 B2
(45) Date of Patent: Aug. 21, 2007

(54) PLANAR DISPLAY MODULE

(75) Inventors: Chia-Jung Wu, Chia Yi Hsien (TW); Wen-Hui Peng, Hsinchu Hsien (TW); Che-Chih Chang, Miaoli County (TW)

(73) Assignee: AU Optronics Corp., Hsinchu (TW)

( * ) Notice: Subject to any disclaimer, the term of this patent is extended or adjusted under 35 U.S.C. 154(b) by 394 days.

(21) Appl. No.: 10/968,078

(22) Filed: Oct. 20, 2004

(65) Prior Publication Data

US 2005/0190333 A1    Sep. 1, 2005

(30) Foreign Application Priority Data

Feb. 27, 2004    (TW) .............................. 93105192 A

(51) Int. Cl.
    *G02F 1/1345*    (2006.01)
(52) U.S. Cl. ...................... 349/150; 349/151; 349/152
(58) Field of Classification Search ......... 349/149–152
    See application file for complete search history.

(56) References Cited

U.S. PATENT DOCUMENTS

| | | | |
|---|---|---|---|
| 5,847,783 A * | 12/1998 | Hiramoto et al. ............. | 349/69 |
| 2003/0067577 A1* | 4/2003 | Yamada ...................... | 349/150 |
| 2006/0082715 A1* | 4/2006 | Lo et al. ..................... | 349/150 |

* cited by examiner

*Primary Examiner*—James A. Dudek
(74) *Attorney, Agent, or Firm*—Troxell Law Office, PLLC

(57) ABSTRACT

A display module includes components of a display panel having an outward first FPC for connecting to a system, wherein the first FPC has a foldable part on which a welding area is defined, and a backlight unit opposite to the display panel for providing illumination for the display panel. The backlight unit has an outward second FPC which is welded with the welding area of the foldable part. Both the foldable part and second FPC are folded and turned around to keep the welding area attach to the backside of the backlight unit.

9 Claims, 3 Drawing Sheets

PLANAR DISPLAY MODULE

FIELD OF THE INVENTION

The present invention relates to a planar display module. More particularly, the present invention relates to a design of disposing a connection between a first FPC of a display panel and a second FPC of a backlight unit at the backside of the backlight unit.

BACKGROUND OF THE INVENTION

A large number of thin film transistors (TFTs), pixel electrodes, and scan lines and data lines across each other are fabricated by processes of depositions, photolithography and etching to form a pixel array on a first glass substrate. In order to provide voltages and signals for activating the TFT in each pixel unit, patterns of electrical circuits are formed on the first glass substrate to electrically connect the pixel array and micro devices on the periphery of the first glass substrate. By this way, timing controller and source drive integrated circuits (ICs) disposed around the first glass substrate and the gate driver IC constructed on the side of the first glass substrate can respectively transmit data signals and scan signals to each pixel unit through the patterns. A color filter and a common electrode layer are formed subsequently on a second glass substrate. In the process of assembling a display panel, the second glass substrate with the color filter and common electrode layer attached thereon is reversed to face the pixel array on the first glass substrate. Thereafter, a liquid crystal (LC) layer is sandwiched between the second and first substrates.

Because the LC layer cannot emit lights by itself, a backlight unit is disposed opposite to the display panel to provide light to the liquid crystal display for displaying images. For example, the backlight unit of a small-scale liquid crystal display (LCD) comprises a light-guide plate, films, a reflector and a light emitting diode (LED). The light-guide plate is preferably an acrylic plate made by injection molding. The LED is constructed at a side of the light-guide plate. Lights emitting from the LED enter the light-guide plate through an edge thereof and transmit to another end of the light-guide plate by total internal reflection. The reflector is opposite to the light-guide plate to avoid light leaking from the surface of the light-guide plate. Further, in order to enhance the uniformity of the light illuminating the surface of the light-guide plate, a brightness enhanced film (BEF) and a diffuser are generally constructed upon the light-guide plate, wherein the diffuser is used to diffuse the lights and the BEF is used to focus the lights.

Referring to FIG. 1, a construction of a display panel 1 and a backlight unit 2 according to the prior art is shown. As described above, the display panel 1 comprises a first glass substrate 10. On the first glass substrate 10 is a displaying area 11 comprising of a second glass substrate and a liquid crystal layer. A source driver IC 12 and a gate driver IC 13 are respectively mounted on the first glass substrate 10 around the displaying area 11 to control a pixel array within the displaying area 11. Generally, an extending flexible printed circuit (FPC) 14 is fabricated at the side near the source driver IC 12. Back-end of the FPC 14 is connected to the source driver IC 12 and the gate driver IC 13 through the circuit layout on the first glass substrate 10, whereas the front-end of the FPC 14 is connected to the system for transmitting controlling signals thereof to the display panel 1.

It is noted that another extending FPC 21 is mounted on an internal sidewall of a casing of the backlight unit 2 for the purpose of providing power to the LED within the backlight unit 2. As shown in the figure, the front end of the FPC 21 is connected to the FPC 14 by welding. Thus, the power from the system is transmitted to the LED through the FPC 14. Now a typical design of the LCD is used as an illustration. A welding area 141 is usually defined on the FPC 14 for the electrical contact of the FPC 21 while assembling the display panel 1 and the backlight unit 2.

It is noted, however, there are serious drawbacks at the electrical contact of the FPC 14 and the FPC 21. Referring to FIG. 2, when the assembling of the display panel 1 and the backlight unit 2 has been accomplished, the assembly will subsequently be accommodated into a casing of a system (e.g. PDA, digital cameras, mobile phones, handheld PC or the like). At this time, the FPC 14 and the FPC 21 are generally folded downward so as to allow the whole assembly to be inserted into the casing of the host system and enable the FPC 14 to be received in a slot, which electrically connect to the interior of the system. Thus, signal connection is built. Under the condition described herein, the welding area 141 on the FPC 14 increases the thickness of the FPC 14. Accordingly, the difficulty in folding the FPC 14 is elevated while assembling. Further, the FPC 21 easily peels off and separates from the welding area 141 of the FPC 14 when the FPC 14 and the FPC 21 connecting at the welding area 141 are folded and bended simultaneously.

In practice, the rate of the short circuit derived from separation between the FPC 14 and FPC 21 is about 5% to 10%. Hence, it is important to seek solutions for solving the problems existing in the present process.

SUMMARY OF THE INVENTION

An object of the present invention is to provide a design in which a welding area for electrically connecting a first FPC of a display panel with a second FPC of a backlight unit is defined on the display panel or on the backside of the backlight unit.

In the first embodiment of the present invention, a first display module comprises a first glass substrate with a plurality of TFTs fabricated thereon, an second glass opposite to the first glass substrate and having a color filter adhered thereto, a liquid crystal layer sandwiched between the first and the second glass substrates, a driver IC mounted on the first glass substrate for driving the TFTs, and a first FPC, wherein back-end of the first FPC is connecting to the driver IC and the front-end is extending outwardly from the first glass substrate for being in contact with a system. The first display module also comprises a welding area defined on the first glass substrate and connecting to the first FPC through circuits, and a backlight unit opposite to the first glass substrate. The backlight unit has an outward second FPC for a purpose of power supply, wherein the front end of the second FPC is welded to the welding area on the first substrate.

In the second embodiment of the present invention, a second display module comprises a first glass substrate with a plurality of TFTs fabricated thereon, an second glass opposite to the first glass substrate and having a color filter adhered thereto, a liquid crystal layer sandwiched between the first and the second glass substrates, a driver IC mounted on the first glass substrate for driving the TFTs, and a first FPC, wherein back-end of the first FPC is connecting to the driver IC and the front-end thereof is extending outwardly from a side of the first glass substrate for being in contact with a system. The first FPC has a foldable part and the front end of the foldable part includes a welding area. The second display module also comprises a backlight unit opposite to the first glass substrate for providing lights to the display module, wherein the backlight unit has an outward second FPC for a purpose of power supply. The front end of the second FPC is welded to the welding area of the foldable part. The foldable part and second FPC are then bended to position the welding area at the rear side of the backlight unit.

BRIEF DESCRIPTION OF THE DRAWINGS

The foregoing aspects and many of the attendant advantages of this invention will become more readily appreciated and understood by referencing the following detailed description in conjunction with the accompanying drawings, wherein.

DESCRIPTION OF THE PERFERRED EMBODIMENTS

Embodiment 1

Figure 1:
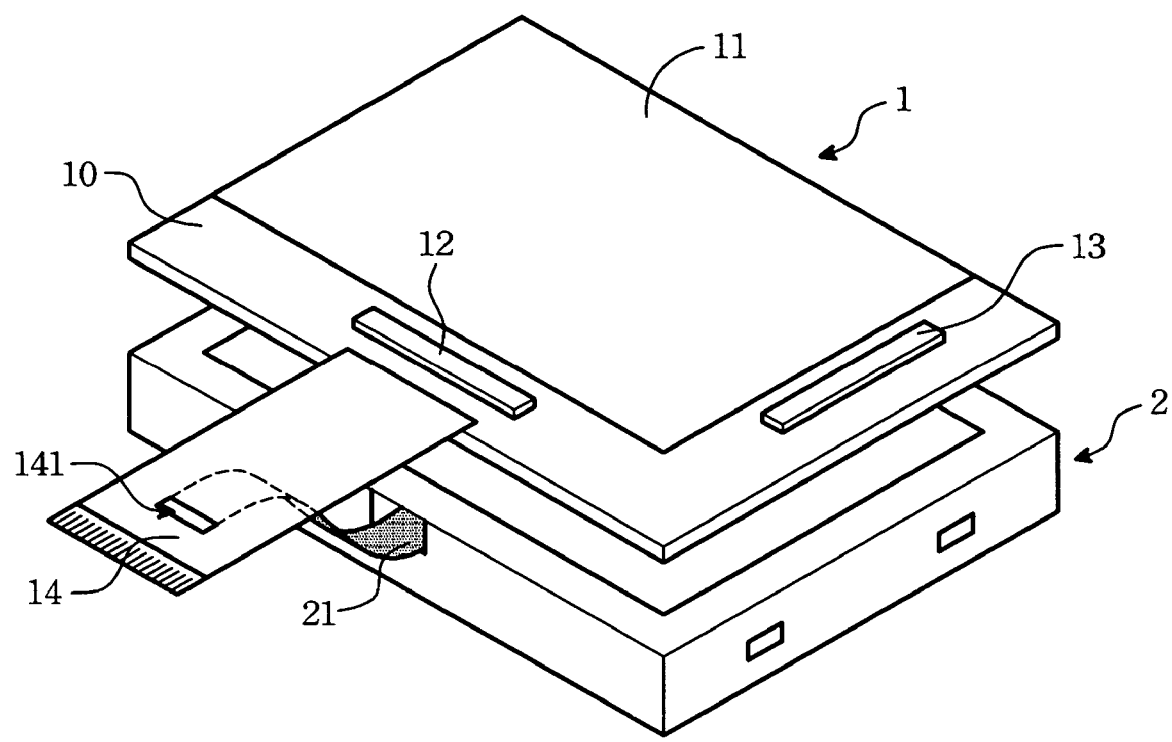
FIG. 1 is a side view of an assembly of a display panel and a backlight unit in accordance with the prior art, showing a conventional connection of a TFT FPC and a LED FPC.
Figure 2:
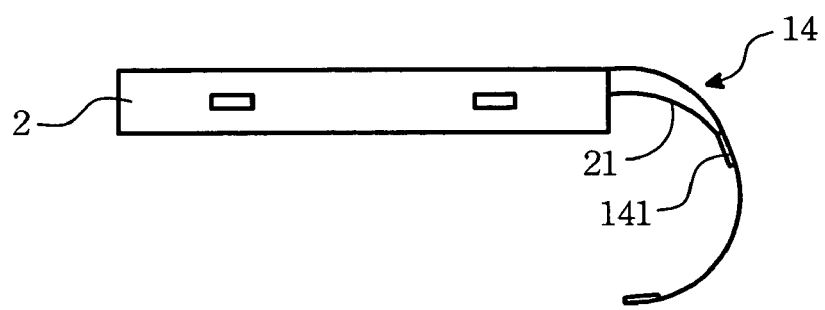
FIG. 2 is a side view of an LCD module in accordance with the prior art, showing the conventional connection of a TFT FPC and a LED FPC.
Figure 3:
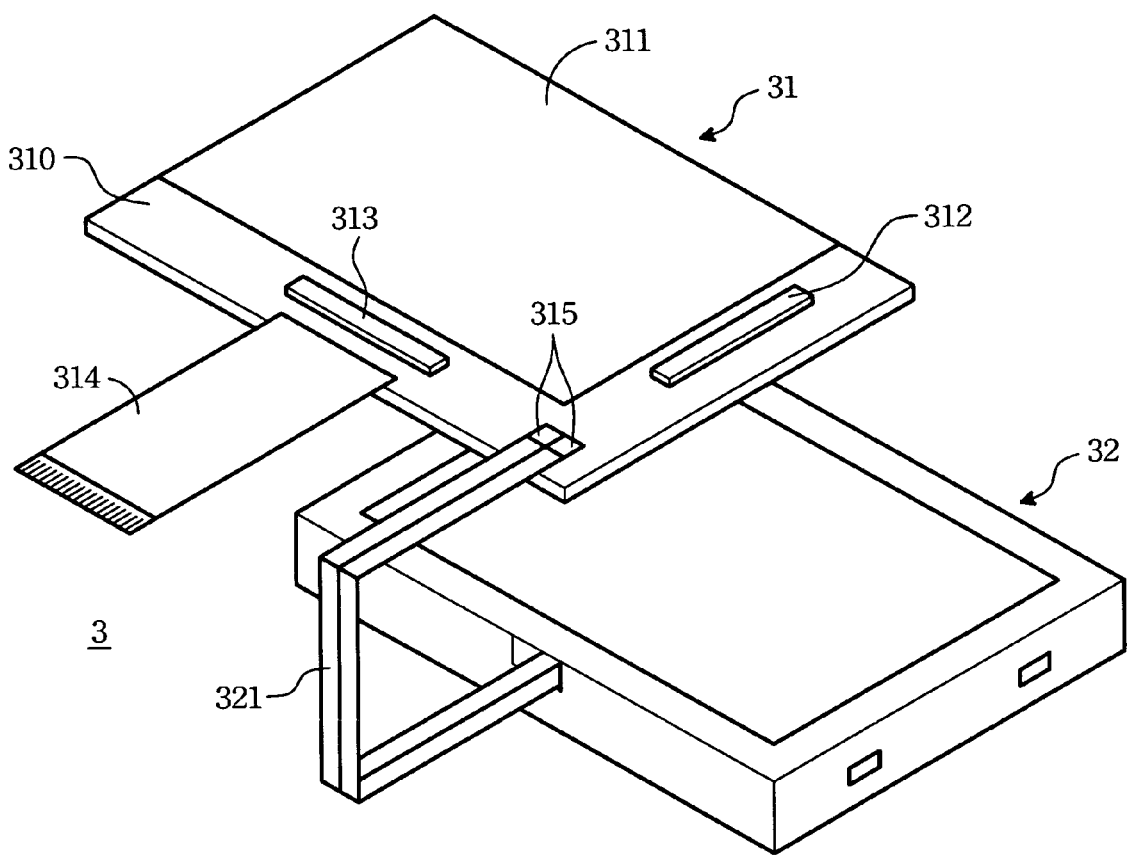
FIG. 3 is a side view of an LCD module in accordance with the first embodiment of the present invention, wherein a second FPC of a backlight unit is electrically connected to a first FPC of a display panel through circuits defined on the display panel.

Referring to FIG. 3, a first LCD module 3 of the first embodiment is shown. The LCD module 3 comprises a display panel 31 and a backlight unit 32 opposite to the display panel 31, wherein the display panel 31 includes a first glass substrate 310 with a plurality of TFTs formed thereon and a second glass substrate 311 with a color filter adhered thereto. The color filter faces TFTs on the first glass substrate 310. Between first glass substrate 310 and the second glass substrate 311 is sandwiched a LC layer for the image formation. Generally speaking, the dimension of the first glass substrate 310 is grater than that of the second glass substrate 311. Thus, a portion of surface of the first glass substrate 310 is exposed after assembling the second glass substrate 311, the first glass substrate 310 and the LC layer. The exposed surface of the first glass substrate 310 is provided for the mounting of driver ICs. As shown in the figure, a gate driver IC 312 is mounted on right side of the first glass substrate 310, whereas a source driver IC 313 is mounted on front side of the first glass substrate 310.

A first FPC 314 is constructed on a side of the first glass substrate 310 near the source driver IC 313. Back-end of the first FPC 314 is electrically connected to the source driver IC 313 and the gate driver IC 312 through circuits defined on the first glass substrate 310. The front-end of the first FPC 314 is in contact with a system to transmit signals produced therefrom to the display panel 31. In the embodiment of the present invention, the first FPC 314 is TFT FPC. It is noted that welding areas 315 are formed on the first glass substrate 310 near a corner and are electrically connected to the first FPC 314 via circuits on the first glass substrate 310.

In addition, a backlight unit 32 is opposite to the display panel 31 for providing illumination to the whole LCD module 3. As shown in the figure, the backlight unit 32 includes a second FPC 321 fabricated for a purpose of providing power to a light source (e.g. LED) of the backlight unit 32. The front-end of the second FPC 321 is connected to the welding area 315 on the first glass substrate 310 by soldering. Accordingly, the backlight unit 32 obtains power from the system through the second FPC 321 and the first FPC 314.

Figure 4:
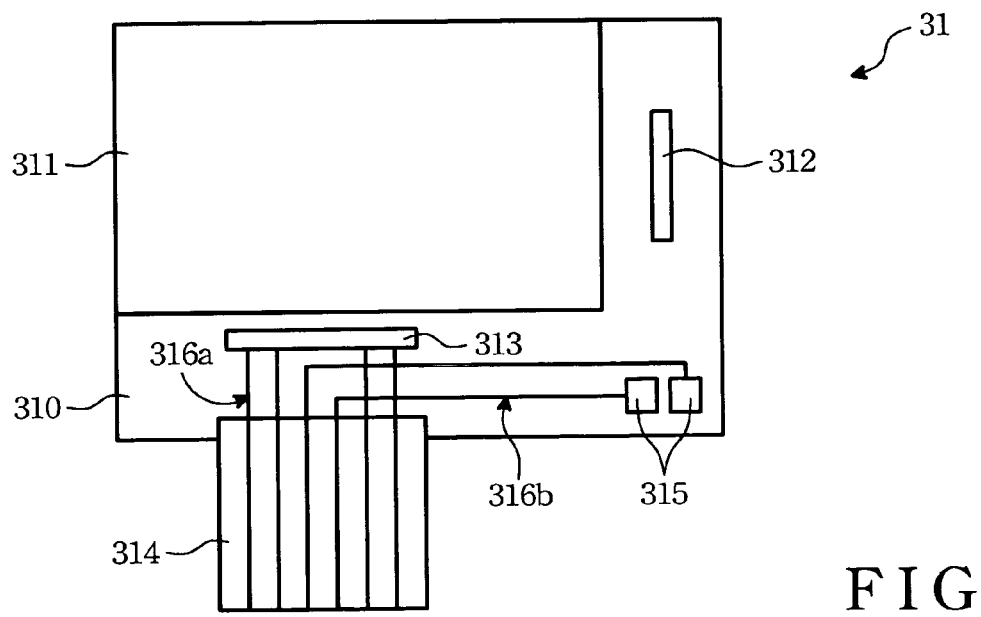
FIG. 4 is a top view of an LCD module in accordance with the first embodiment of the present invention.

Referring to FIG. 4, a top view of the display panel 31 is shown. The gate driver IC 312 and the source driver IC 313 are mounted on the right side and the front side of the first glass substrate 310, respectively. The first FPC 314 fabricated on the side of the first glass substrate 310 is electrically connected to the source driver IC 313 via a circuit 316*a*, whereas the welding area 315 defined at a corner of the first glass substrate 310 is electrically connected to the source driver IC 313 via a circuit 316*b*.

It is noted that since the front end of the second FPC 321 is welded on the display panel 31, the welding area 315 provided for the connection of the second FPC 321 and the display panel 31 will not be injured even though the first FPC 314 is needed to be folded and bended in the following processes. In other words, drawbacks of peeling off and separation described in the prior art can be effectively avoided. In addition, though the position of the welding area 315 is defined at a corner of the first glass substrate 310, this is not limited to the score and the spirit of the present invention. That is, the welding area 315 can be defined at any location on the first glass substrate 310.

Embodiment 2

Figure 5:
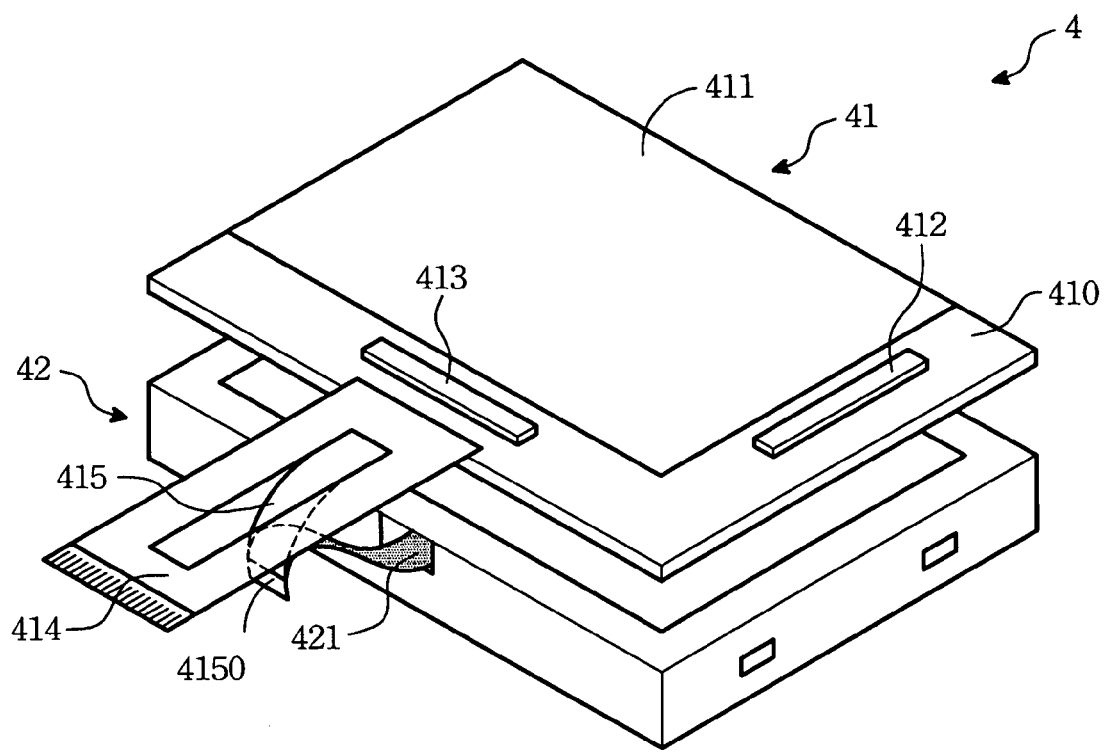
FIG. 5 is a side view of an LCD module in accordance with the second embodiment of the present invention, wherein a first FPC of a display panel has a foldable part and a second FPC of a backlight unit is electrically connected to a welding area defined on the foldable part.

Referring to FIG. 5, a second LCD module 4 of the second embodiment is shown. As described above, the second LCD module 4 comprises a display panel 41 and a backlight unit 42 opposite to the display panel 41, wherein the display panel 41 includes a first glass substrate 410, a second glass substrate 311 and a LC layer sandwiched therebetween. A gate driver IC 412 and a source driver IC 413 are respectively mounted on the right side and the front side of the first glass substrate 410 for driving TFTs fabricated on the first glass substrate 410. In addition, Back-end of a first FPC 414 is electrically connected to the source driver IC 413, whereas the front-end thereof extends outwardly to connect a system.

It is noted that the first FPC 414 has a folding part 415 formed by substantially U-shaped cutting. A welding area 4150 is defined at the front end of the foldable part 415 for the connection of the second FPC 421 of the backlight unit 42. As shown in the figure, the foldable part 415 can be folded and bended upward or downward according to the need of the processes. In this embodiment, the foldable part 415 is folded downward to attach to the backside of the backlight unit 42. It is noted that the foldable part 415 can be formed by other kinds and shapes of cutting though the substantially U-shaped cutting is illustrated herein.

The backlight unit 42 opposite to the first glass substrate 410 is provided for illumination of the whole LCD module 4. As described above, the backlight unit 42 includes a second FPC 421 for a purpose of providing power to a light source (e.g. LED) of the backlight unit 42. In this embodiment, the front end of the second FPC 421 is connected to the welding area 4150 defined on the front end of the foldable part 415. In a preferred embodiment, the front end of the second FPC 421 is connected to the welding area 4150 defined on the front end of the foldable part 415 by soldering.

Figure 6:
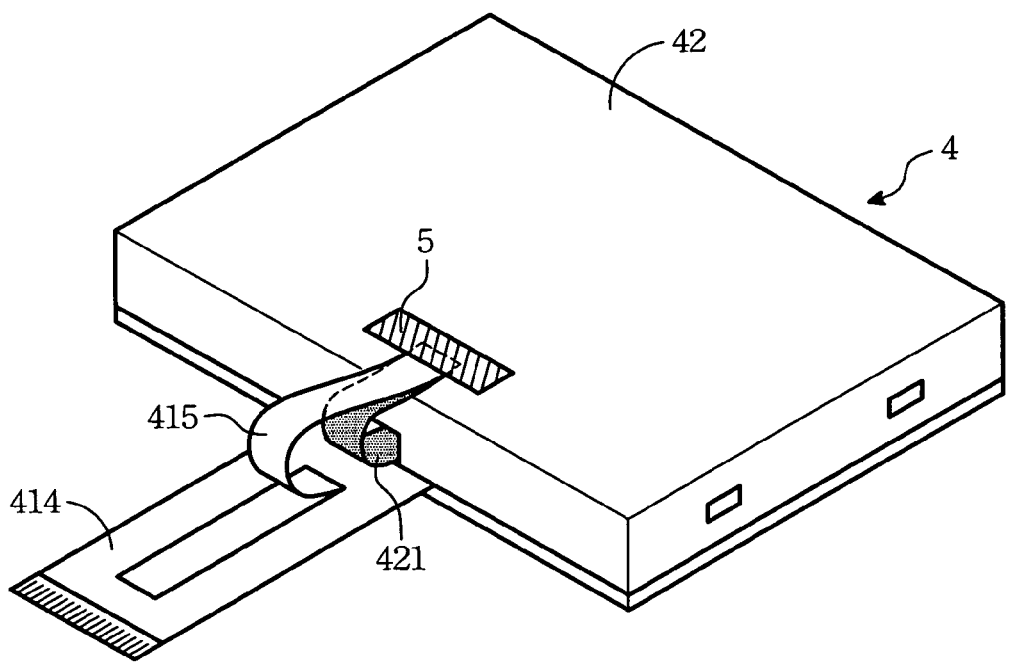
FIG. 6 is a sectional view of an LCD in accordance with the second embodiment of the present invention, wherein the foldable part is folded and fixed to the rear side of the backlight unit.

After soldering the second FPC 421 of the backlight unit 42 to the welding area 4150 of the foldable part 415, the foldable part 415 together with the second FPC 421 is turned around and attached to the backside of the backlight unit 42. The welding area 4150 is fixed to the backlight unit 42 by adhesive material, such as glue, tape or the like. In other words, the second FPC 421 together with the foldable part 415 is folded to fix the welding area 4150 to the backside of the backlight unit 42. As shown in FIG. 6, the foldable part 415 is folded and fixed to the backside of the backlight unit 42 casing. In addition, the foldable part 415 together with the second FPC 421 is turned around to fix the welding area 4150 of the foldable part 415 to the backside of the casing by a tape 5.

In this embodiment, since the welding area 4150 is fixed to the backside of the casing of the LCD module 4, the welding area 4150 will not be injured even though the first FPC 414 is needed to be folded and bended in the following processes. Accordingly, drawbacks of peeling off and chap in the prior art can be effectively avoided. It is noted that the position where the welding area 4150 fixed to is not used to limit the score and the spirit of the present invention. That is, the welding area 4150 can be fixed to any location of the LCD module 4. For example, the welding area 4150 can be fixed on the display panel 41 or a position between the display panel 41 and the backlight unit 42.

Because the welding area provided for the connection of the second FPC and first FPC is now defined on the display panel or attached to the casing of the backlight unit, the welding area will not be injured when the first FPC is needed to be folded and bended in the following processes. For the design illustrated in embodiment 1, the thickness of the first FPC is effectively decreased. In addition, the first FPC can be folded and bended much easier.

As to the design described in embodiment 2, since the foldable part is formed by cutting the first FPC and the welding area is defined on the foldable part, the foldable part can be folded and turned around to fix the welding area to the backlight unit after soldering the first FPC and second FPC together. Thus, problems existing in the prior arts can be solved too.

While the preferred embodiments of the present invention have been illustrated and described, it is appreciated that modifications and variations can be made therein without departing from the spirit and scope of the present invention. For example, disclosures in the present invention can be applied to various kinds of planar displays, such as plasma discharge panels (PDPs), field emission displays (FEDs) and organic light emitting diodes (OLEDs), etc.

What is claimed is:

1. A display module having a display panel and a backlight unit, comprising:
   a first FPC extending outwardly from the display panel and electrically connecting to a system;
   a welding area electrically connected to the first FPC through a circuit on the display panel; and
   a second FPC extending outwardly from the backlight unit and contacting with the welding area.

2. The display module of claim 1, wherein the display panel comprises a first substrate, a second substrate and a liquid crystal layer disposed therebetween.

3. The display module of claim 2, wherein the welding area is defined at a corner of the first substrate.

4. The display module of claim 2, wherein the display panel further comprises a driver IC electrically connecting to the first FPC through the circuit.

5. The display module of claim 4, wherein the driver IC is mounted on the first substrate and electrically connects to the first FPC through the circuit.

6. The display module of claim 1, wherein the second FPC is connected to a light source of the backlight unit for providing power.

7. A display module, comprising:
   a first substrate with a plurality of thin film transistors;
   a second substrate with a color filter opposite to the first substrate;
   a liquid crystal layer sandwiched between the first substrate and the second substrate;
   a driver IC mounted on the first substrate;
   a first FPC, wherein a back-end thereof is electrically connected to the driver IC and a front-end extending outwardly to connect to a system;
   a welding area electrically connecting to the first FPC through a circuit; and
   a backlight unit opposite to the first substrate, the backlight unit including a second FPC extending outwardly to be in contact with the welding area on the first substrate.

8. The liquid crystal display of claim 7, wherein the welding area is defined at a corner of the first substrate and electrically connects to the first FPC through the circuit.

9. The liquid crystal display of claim 7, wherein the driver IC is a source IC or a gate IC electrically connected to the first FPC through the circuit.

* * * * *